US012125516B2

(12) United States Patent
Kim et al.

(10) Patent No.: US 12,125,516 B2
(45) Date of Patent: Oct. 22, 2024

(54) SEMICONDUCTOR APPARATUS AND SEMICONDUCTOR MEMORY APPARATUS

(71) Applicant: SK hynix Inc., Icheon-si (KR)

(72) Inventors: Dong Keun Kim, Icheon-si (KR); Min Kang, Icheon-si (KR); Dong Uc Ko, Icheon-si (KR); Young Su Oh, Icheon-si (KR); Hyun Ju Yoon, Icheon-si (KR); Jun Hyun Chun, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 18/298,985

(22) Filed: Apr. 11, 2023

(65) Prior Publication Data

US 2023/0253026 A1    Aug. 10, 2023

Related U.S. Application Data

(62) Division of application No. 17/365,771, filed on Jul. 1, 2021, now abandoned.

(30) Foreign Application Priority Data

Feb. 23, 2021   (KR) .................. 10-2021-0024098

(51) Int. Cl.
*G11C 11/406* (2006.01)
*G01K 3/00* (2006.01)
*G11C 11/4096* (2006.01)

(52) U.S. Cl.
CPC ........ *G11C 11/40626* (2013.01); *G01K 3/005* (2013.01); *G11C 11/4096* (2013.01)

(58) Field of Classification Search
CPC ................................. G11C 11/40626

USPC ..................................... 365/189.14
See application file for complete search history.

(56) References Cited

U.S. PATENT DOCUMENTS

| 8,004,919 B2 | 8/2011 | Thorp et al. |
| 2005/0276144 A1 | 12/2005 | Min et al. |
| 2006/0212255 A1 | 9/2006 | Hasui |
| 2018/0166117 A1* | 6/2018 | Choi ............... G11C 29/40 |
| 2019/0378564 A1* | 12/2019 | Chang ............... G11C 11/40626 |
| 2020/0176047 A1* | 6/2020 | Meier ............... G11C 11/40626 |
| 2021/0218085 A1 | 7/2021 | Ge et al. |

FOREIGN PATENT DOCUMENTS

| KR | 1020030005499 A | 1/2003 |
| KR | 100906683 B1 | 7/2009 |
| KR | 101265894 B1 | 5/2013 |

OTHER PUBLICATIONS

Jim Handy, Super-Cooled DRAM for Big Power Savings, Objective Analysis, on Semiconductor Memories, The Memory Guy, Jun. 28, 2017, https://thememoryguy.com/super-cooled-dram-for-big-power-savings/.

* cited by examiner

*Primary Examiner* — Anthan Tran
(74) *Attorney, Agent, or Firm* — WILLIAM PARK & ASSOCIATES LTD.

(57) ABSTRACT

A semiconductor apparatus includes a temperature detecting circuit and a temperature raising circuit. The temperature detecting circuit detects a temperature to generate temperature detection information. The temperature raising circuit generates heat through a toggling operation based on the temperature detection information.

3 Claims, 5 Drawing Sheets

SEMICONDUCTOR APPARATUS AND SEMICONDUCTOR MEMORY APPARATUS

CROSS-REFERENCES TO RELATED APPLICATION

The present application is a divisional application of U.S. patent application Ser. No. 17/365,771, filed on Jul. 1, 2021, and claims priority under 35 U.S.C. § 119(a) to Korean application number 10-2021-0024098, filed on Feb. 23, 2021, in the Korean Intellectual Property Office, which is incorporated herein by reference in its entirety as set forth in full.

BACKGROUND

1. Technical Field

Various embodiments generally relate to a semiconductor apparatus and a semiconductor memory apparatus, and, more particularly, to a semiconductor apparatus and a semiconductor memory apparatus capable of guaranteeing a stable circuit operation at a low temperature.

2. Related Art

In general, an integrated circuit such as a semiconductor apparatus and a semiconductor memory apparatus should perform a stable circuit operation even at variously changing environments. A temperature is one of the environments that can affect the integrated circuit. The integrated circuit should perform a stable circuit operation even when a temperature variously changes.

Recently, a number of electronic parts mounted in a vehicle becomes greater. The vehicle is mainly parked outside and thus the electronic parts mounted in the vehicle can be greatly affected by a temperature. Especially, an extremely low temperature in a winter can cause malfunction of the electronic parts mounted in the vehicle. The malfunction of the electronic parts mounted in the vehicle is suspected as a main cause of the sudden unintended acceleration of the vehicle. Therefore, there is a great need for a solution to the malfunction of the electronic parts mounted in the vehicle at a low temperature.

SUMMARY

In accordance with an embodiment of the present disclosure, a semiconductor apparatus may include a temperature detecting circuit and a temperature raising circuit. The temperature detecting circuit may be configured to detect a temperature to generate temperature detection information. The temperature raising circuit may be configured to generate heat through a toggling operation based on the temperature detection information.

In accordance with an embodiment of the present disclosure, a semiconductor memory apparatus may include a command decoding circuit, a temperature detecting circuit, a refresh control circuit and a memory bank circuit. The command decoding circuit may be configured to generate an internal refresh command signal based on an external command signal. The temperature detecting circuit may be configured to detect a temperature to generate temperature detection information. The refresh control circuit may be configured to generate a refresh control signal, which toggles at a first frequency, based on the internal refresh command signal during a refresh operation and configured to generate the refresh control signal, which toggles at a second frequency higher than the first frequency, based on the temperature detection information during a heating operation. The memory bank circuit may be configured to perform a refresh operation based on the refresh control signal. The refresh control circuit may be configured to generate heat through a toggling operation.

In accordance with an embodiment of the present disclosure, a semiconductor memory apparatus may include a temperature detecting circuit, a heating control circuit and a memory bank circuit. The temperature detecting circuit may be configured to detect a temperature to generate temperature detection information. The heating control circuit may be configured to provide, based on the temperature detection information, a command control signal and a heating data signal that toggles. The memory bank circuit may be configured to store therein the heating data signal based on the command control signal. The memory bank circuit may be configured to generate heat through a toggling operation.

DETAILED DESCRIPTION

The description of the present disclosure is merely an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of the steps, symbols (e.g., a, b, and c) are used for convenience of description, and the symbols do not describe order of the steps. The steps may be performed in order different from order described in the context unless specific order is clearly described in the context. That is, the steps may be performed according to described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

In accordance with an embodiment of the present disclosure, provided is a semiconductor apparatus and a semiconductor memory apparatus capable of performing a heating operation at a temperature lower.

Figure 1:
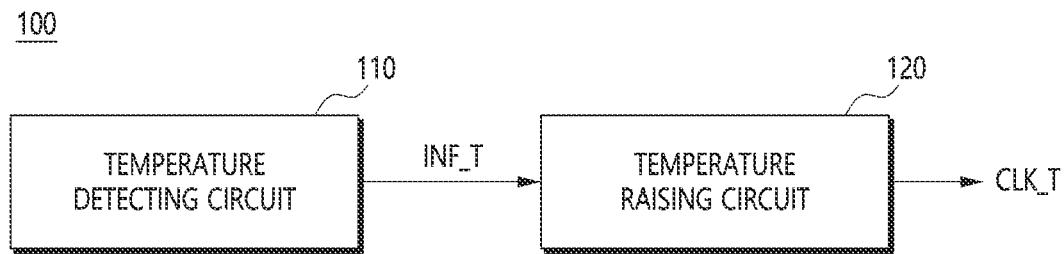
FIG. 1 is a block diagram illustrating a configuration of a semiconductor apparatus in accordance with an embodiment.

FIG. 1 is a block diagram illustrating a configuration of a semiconductor apparatus 100 in accordance with an embodiment.

Referring to FIG. 1, the semiconductor apparatus 100 may include a temperature detecting circuit 110 and a temperature raising circuit 120.

The temperature detecting circuit 110 may be configured to detect a temperature to generate temperature detection information INF_T. In this disclosure, a temperature is the one affecting the semiconductor apparatus 100 and includes a peripheral and external temperature of the semiconductor apparatus 100 and an internal temperature of the semiconductor apparatus 100. The temperature detecting circuit 110 may include at least one comparing circuit. The temperature detecting circuit 110 may compare a temperature and a reference temperature to generate the temperature detection information INF_T. The temperature detection information INF_T may include a signal that is enabled when the temperature is lower than the reference temperature.

The temperature raising circuit 120 may be configured to generate heat through a toggling operation based on the temperature detection information INF_T. The temperature raising circuit 120 may be configured to generate a heating clock signal CLK_T that toggles according to the temperature detection information INF_T. The temperature raising circuit 120 may generate heat through a toggling operation and may generate the heating clock signal CLK_T that toggles when generating the heat.

In accordance with an embodiment of the present disclosure, the semiconductor apparatus 100 may generate the temperature detection information INF_T that is enabled according to a low temperature. Based on the temperature detection information INF_T, the semiconductor apparatus 100 may generate heat through a toggling operation. Therefore, the semiconductor apparatus 100 may secure a temperature, at which an operation is stably performed because of the generated heat.

Figure 2:
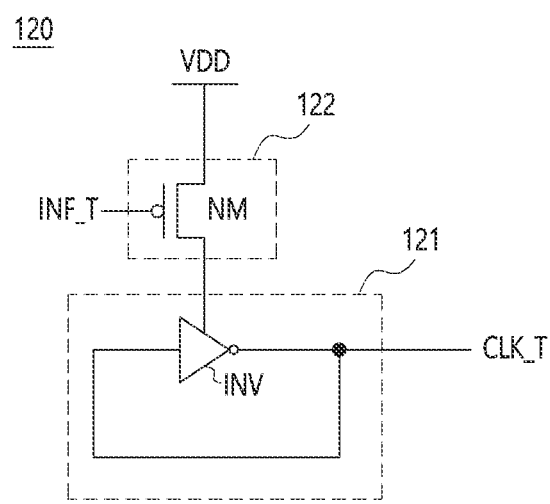
FIG. 2 is a block diagram illustrating a configuration of a temperature raising circuit illustrated in FIG. 1.

FIG. 2 is a block diagram illustrating a configuration of the temperature raising circuit 120 illustrated in FIG. 1.

Referring to FIG. 2, the temperature raising circuit 120 may include an oscillating circuit 121 and an activating circuit 122.

The oscillating circuit 121 may be configured to generate the heating clock signal CLK_T through an oscillating operation. The oscillating circuit 121 may include an inverter INV. The inverter INV may invert an input signal to output an inverted signal and may receive the output signal, i.e., the inverted signal, as the input signal. Therefore, the inverter INV may perform the oscillating operation through the repetitive inverting operation. The inverter INV itself may generate heat through the oscillating operation. For example, the oscillating circuit 121 may generate heat in response to the oscillating operation performed by the inverter INV.

The activating circuit 122 may be configured to activate the oscillating operation based on the temperature detection information INF_T. The activating circuit 122 may include a NMOS transistor NM coupled to the inverter INV.

Hereinafter, described briefly is a circuit operation of the temperature raising circuit 120.

The temperature detection information INF_T may correspond to a signal that is enabled when a temperature is lower than the reference temperature. The temperature detection information INF_T may be a signal that is enabled to a logic low at a low temperature. Therefore, the NMOS transistor NM may be turned on according to the temperature detection information INF_T having a logic low level. When the NMOS transistor NM is turned on, the inverter INV may be activated and may perform the inverting operation. Through the repetitive inverting operation, the inverter INV may perform the oscillating operation.

With such configuration as described above, the temperature raising circuit 120 may perform the oscillating operation at a low temperature. Through the oscillating operation, the temperature raising circuit 120 may generate heat. In accordance with an embodiment of the present disclosure, the semiconductor apparatus 100 may be provided with the heat from the temperature raising circuit 120 at a low temperature. The semiconductor apparatus 100 may secure a temperature, at which the semiconductor apparatus 100 can perform a stable circuit operation because of the provided heat.

The temperature detection information INF_T may be disabled when the temperature is higher than the reference temperature. The temperature detection information INF_T may be a signal that is disabled to a logic high at a high temperature. Accordingly, the oscillating circuit 121 may stop the oscillating operation.

The semiconductor apparatus 100 may be configured to generate, in an initial drive interval, the temperature detection information INF_T that is enabled to a logic low regardless of the temperature. Therefore, in the initial drive interval, the semiconductor apparatus 100 may secure an appropriate temperature through the oscillating operation. After the initial drive interval, the semiconductor apparatus 100 may be configured to generate the temperature detection information INF_T according to the temperature. Therefore, after the initial drive interval, the semiconductor apparatus 100 may perform or stop the oscillating operation according to the temperature.

Figure 3:
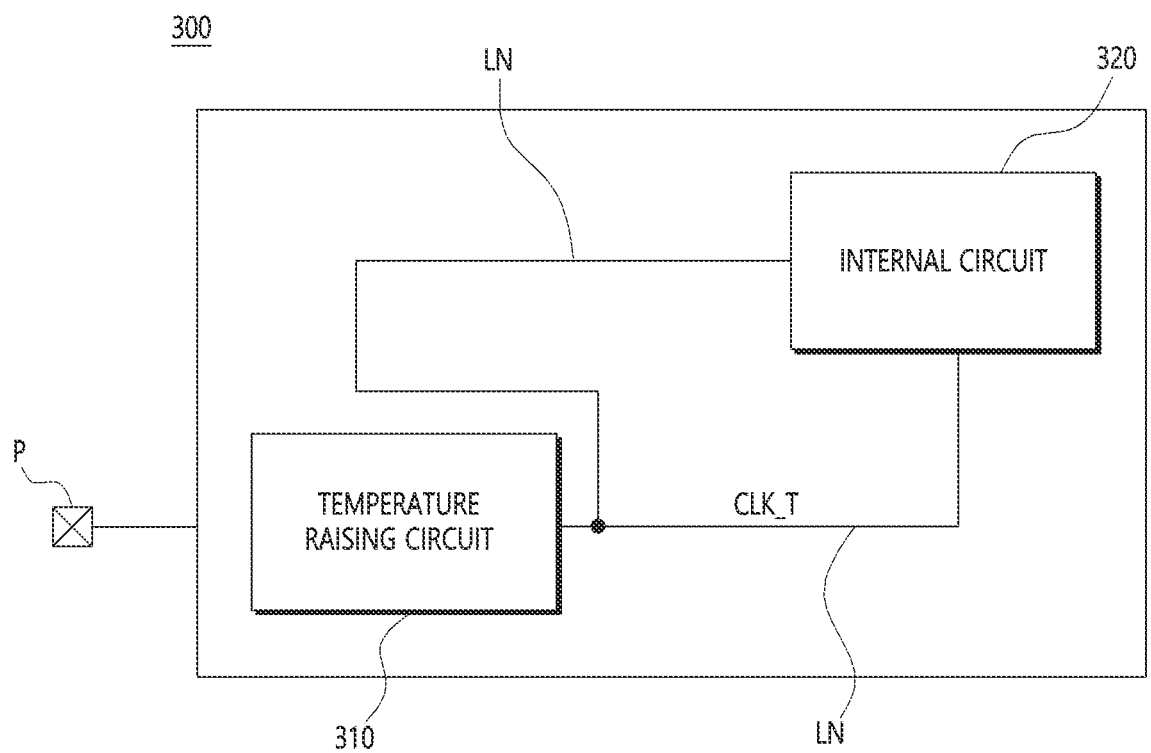
FIG. 3 is a block diagram illustrating a configuration of a semiconductor apparatus in accordance with an embodiment.

FIG. 3 is a block diagram illustrating a configuration of a semiconductor apparatus 300 in accordance with an embodiment.

Referring to FIG. 3, the semiconductor apparatus 300 may include a temperature raising circuit 310 and an internal circuit 320. The temperature raising circuit 310 may correspond to the temperature raising circuit 120 illustrated in FIGS. 1 and 2. The internal circuit 320 may be configured to receive the heating clock signal CLK_T.

The heating clock signal CLK_T may be transferred to the internal circuit 320 through a transferring line LN. There may be a parasitic capacitance element in the transferring line LN. Therefore, when the heating clock signal CLK_T is transferred to the internal circuit 320 while toggling, the transferring line LN itself may also generate heat.

With such configuration as described above, the semiconductor apparatus 300 may generate heat through the temperature raising circuit 310 and the transferring line LN transferring the heating clock signal CLK_T. In accordance with an embodiment of the present disclosure, the semiconductor apparatus 300 may generate heat at a low temperature. The semiconductor apparatus 300 may secure a temperature, at which a stable circuit operation can be performed because of the generated heat.

The temperature raising circuit 310 may be enabled according to the temperature detection information INF_T, which is similar to the temperature raising circuit 120 illustrated in FIGS. 1 and 2. As described above with reference to FIG. 1, the temperature detection information INF_T may be provided from the temperature detecting circuit 110 included in the semiconductor apparatus 300. The temperature detection information INF_T may be provided from an external through a pad P.

Figure 4:
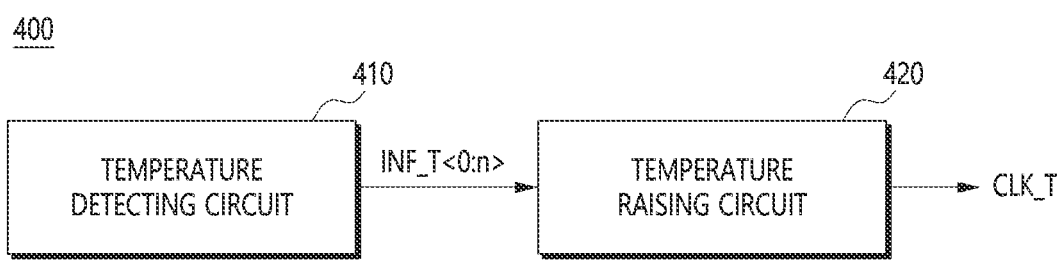
FIG. 4 is a block diagram illustrating a configuration of a semiconductor apparatus in accordance with an embodiment.

FIG. 4 is a block diagram illustrating a configuration of a semiconductor apparatus 400 in accordance with an embodiment.

Referring to FIG. 4, the semiconductor apparatus 400 may include a temperature detecting circuit 410 and a temperature raising circuit 420.

The temperature detecting circuit 410 may be configured to detect a temperature to generate temperature detection information INF_T<0: n>, 'n' being a natural number. The temperature detecting circuit 410 may include a plurality of comparing circuits. The temperature detecting circuit 410 may compare the temperature with a plurality of reference temperatures to generate the temperature detection information INF_T<0: n> of a code type corresponding to the temperature. For example, the temperature detection information INF_T<0: n> may be a signal of a 4-bit code type corresponding to a range between −30° and +10° Celsius. In an embodiment, the temperature detection information INF_T<0: n> may be a signal of a 4-bit code type corresponding to a range between −30° and +10° Celsius.

The temperature raising circuit 420 may be configured to generate a heating clock signal CLK_T that toggles at different frequencies according to the temperature detection information INF_T<0:n>. For example, in order to generate the heating clock signal CLK_T toggling at different frequencies, the temperature raising circuit 420 may include a plurality of elements each having the same configuration as the temperature raising circuit 120 illustrated in FIG. 2.

The temperature raising circuits 120 may have different propagation delay characteristics from each other. Therefore, the temperature raising circuits 120 may be configured to generate the heating clock signal CLK_T of different frequencies from each other. The different propagation delay characteristics may be implemented by different numbers of the inverters included in the respective temperature raising circuits 120 from each other or different drivabilities of the inverters included in the respective temperature raising circuits 120 from each other. With such configuration as described above, the temperature raising circuits 120 may be activated on the basis of the respective codes of the temperature detection information INF_T<0:n>. The activated temperature raising circuits 120 may generate the heating clock signal CLK_T that toggles at respective frequencies.

In accordance with an embodiment of the present disclosure, the semiconductor apparatus 400 may generate the temperature detection information INF_T<0:n> of the code type according to a low temperature. Based on the temperature detection information INF_T<0:n>, the semiconductor apparatus 400 may generate the heating clock signal CLK_T having different frequencies from each other. As the frequency of the heating clock signal CLK_T becomes greater, the semiconductor apparatus 400 may secure an appropriate temperature more promptly.

Figure 5:
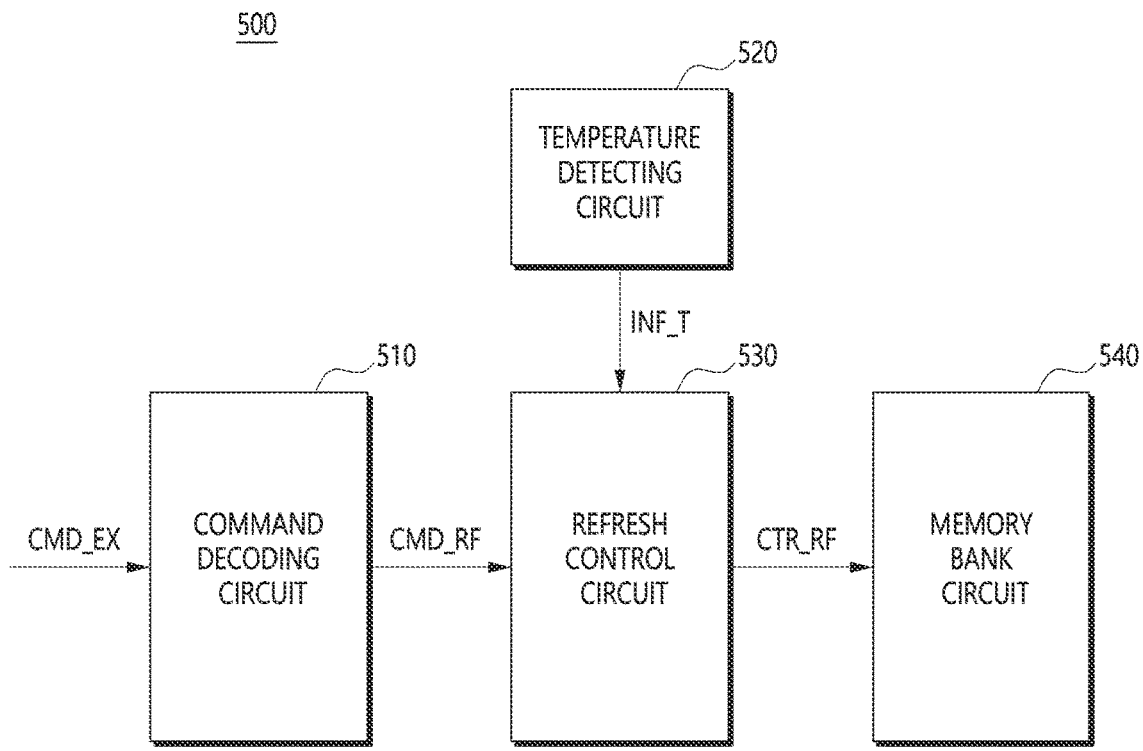
FIG. 5 is a block diagram illustrating a configuration of a semiconductor memory apparatus in accordance with an embodiment.

FIG. 5 is a block diagram illustrating a configuration of a semiconductor memory apparatus 500 in accordance with an embodiment.

Referring to FIG. 5, the semiconductor memory apparatus 500 may include a command decoding circuit 510, a temperature detecting circuit 520, a refresh control circuit 530 and a memory bank circuit 540.

The command decoding circuit 510 may be configured to generate an internal refresh command signal CMD_RF based on an external command signal CMD_EX. The command decoding circuit 510 may generate a plurality of internal command signals based on the external command signal CMD_EX. The plurality of internal command signals may include an internal read command signal corresponding to a read operation and an internal write command signal corresponding to a write operation. Also, the plurality of internal command signals may include an internal refresh command signal CMD_RF corresponding to a refresh operation. The refresh operation may be an operation of amplifying again data stored in a memory cell and storing the amplified data back into the memory cell. The refresh operation may be activated at a predetermined period. The word "predetermined" as used herein with respect to a parameter, such as a predetermined period, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The temperature detecting circuit 520 may be configured to detect a temperature to generate the temperature detection information INF_T. For example, the temperature detecting circuit 520 may correspond to the temperature detecting circuit 110 illustrated in FIG. 1. The temperature detecting circuit 520 may compare the temperature with the reference temperature to generate the temperature detection information INF_T. The temperature detection information INF_T may include a signal that is enabled when the temperature is lower than the reference temperature.

The refresh control circuit 530 may be configured to generate a refresh control signal CTR_RF during any of a refresh operation and a heating operation. The heating operation may be an operation of generating heat at a low temperature, as described with reference to FIGS. 1 to 4. During a refresh operation, the refresh control circuit 530 may generate the refresh control signal CTR_RF, which toggles at a first frequency, based on the internal refresh command signal CMD_RF. During a heating operation, the refresh control circuit 530 may generate the refresh control signal CTR_RF, which toggles at a second frequency higher than the first frequency, based on the temperature detection information INF_T.

The memory bank circuit 540 may be configured to perform a refresh operation based on the refresh control signal CTR_RF. The memory bank circuit 540 may include a memory cell and a driving circuit. The memory cell may be configured to store data. The driving circuit may be configured to control drive of the memory cell.

In accordance with an embodiment of the present disclosure, the semiconductor memory apparatus 500 may generate the refresh control signal CTR_RF toggling at the second frequency during a heating operation. Therefore, the refresh control circuit 530 itself may generate heat through the toggling operation. Further, a transferring line configured to transfer the refresh control signal CTR_RF, which is toggling, may generate heat, itself. As a result, the semiconductor memory apparatus 500 may secure an appropriate temperature, at which a stable circuit operation can be performed because of the generated heat.

Figure 6:
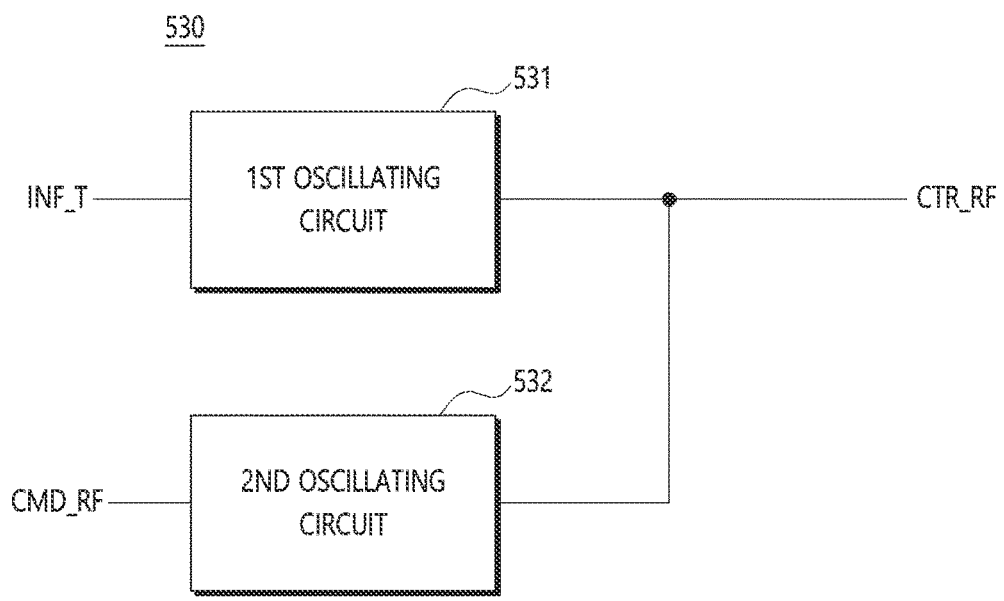
FIG. 6 is a block diagram illustrating a configuration of a refresh control circuit illustrated in FIG. 5.

FIG. 6 is a block diagram illustrating a configuration of the refresh control circuit 530 illustrated in FIG. 5.

Referring to FIG. 6, the refresh control circuit 530 may include a first oscillating circuit 531 and a second oscillating circuit 532.

The first oscillating circuit 531 may be configured to be activated on the basis of the temperature detection information INF_T and configured to generate the refresh control signal CTR_RF having the second frequency. The first oscillating circuit 531 may correspond to the temperature raising circuit 120 illustrated in FIG. 2.

The second oscillating circuit 532 may be configured to be activated on the basis of the internal refresh command signal CMD_RF and configured to generate the refresh control signal CTR_RF having the first frequency. The second oscillation circuit 532 may activate when a refresh operation of a normal operation.

In accordance with an embodiment of the present disclosure, the semiconductor memory apparatus 500 may include the first oscillating circuit 531 that may be activated during a heating operation. The first oscillating circuit 531 itself may generate heat through a toggling operation. During a heating operation, the first oscillating circuit 531 may generate the refresh control signal CTR_RF that toggles at a higher frequency than during the refresh operation.

Figure 7:
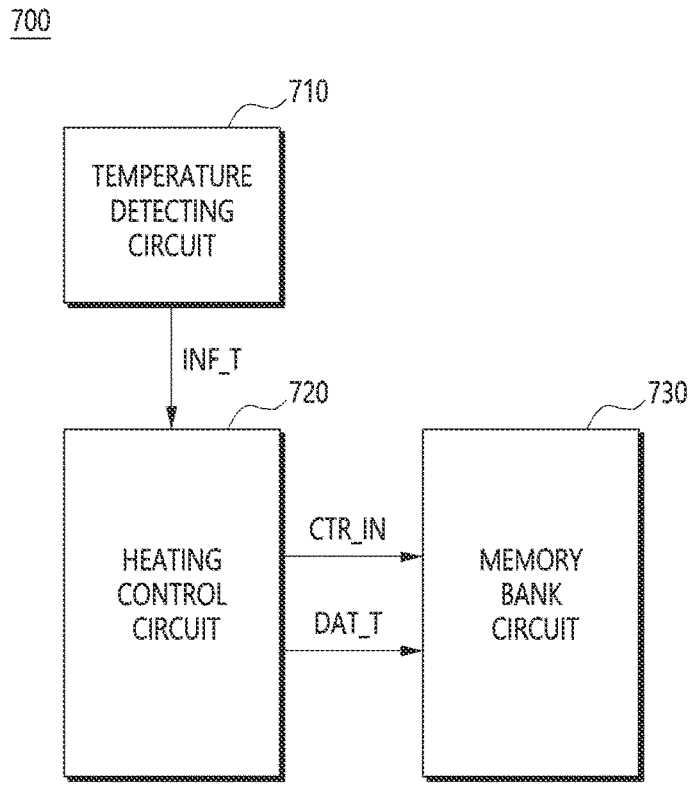
FIG. 7 is a block diagram illustrating a configuration of a semiconductor memory apparatus in accordance with an embodiment.

FIG. 7 is a block diagram illustrating a configuration of a semiconductor memory apparatus 700 in accordance with an embodiment.

Referring FIG. 7, the semiconductor memory apparatus 700 may include a temperature detecting circuit 710, a heating control circuit 720 and a memory bank circuit 730.

The temperature detecting circuit 710 may be configured to detect a temperature to generate the temperature detection information INF_T. For example, the temperature detecting circuit 710 may correspond to the temperature detecting circuit 110 illustrated in FIG. 1. The temperature detecting circuit 710 may compare the temperature with the reference temperature to generate the temperature detection information INF_T. The temperature detection information INF_T may include a signal that is enabled when the temperature is lower than the reference temperature.

The heating control circuit 720 may be configured to provide, based on the temperature detection information INF_T, a command control signal CTR_IN and a heating data signal DAT_T that toggles. The heating control circuit 720 may be differently embodied according to a forcible write mode and an inversion write mode, which will be described with reference to FIGS. 8 and 9.

The memory bank circuit 730 may be configured to store therein the heating data signal DAT_T based on the command control signal CTR_IN. As described above, the heating data signal DAT_T may be a signal that toggles. The memory bank circuit 730 may perform a toggling operation while storing therein the heating data signal DAT_T that toggles. As a result, the memory bank circuit 730 may generate heat through the toggling operation.

Figure 8:
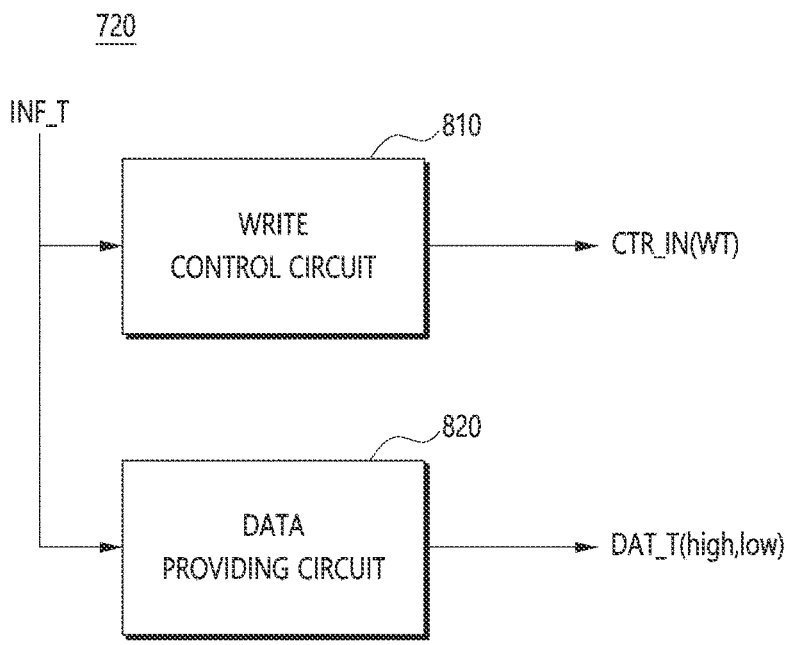
FIG. 8 is a block diagram illustrating a configuration of a heating control circuit illustrated in FIG. 7.

FIG. 8 is a block diagram illustrating a configuration of the heating control circuit 720 illustrated in FIG. 7. The configuration of the heating control circuit 720 illustrated in FIG. 8 may correspond to the forcible write mode. In the forcible write mode, a write operation WT may be performed to store the heating data signal DAT_T, which toggles, in the memory bank circuit 730 illustrated in FIG. 7. Therefore, the command control signal CTR_IN illustrated in FIG. 7 may include a write control signal for the write operation WT. Hereinafter, for convenience of description, the command control signal CTR_IN may be referred to as the write control signal CTR_IN.

Referring to FIG. 8, the heating control circuit 720 may include a write control circuit 810 and a data providing circuit 820.

The write control circuit 810 may be configured to generate the write control signal CTR_IN based on the temperature detection information INF_T. The write control signal CTR_IN may be a signal to control the write operation WT of the memory bank circuit 730 illustrated in FIG. 7.

The data providing circuit 820 may be configured to provide, based on the temperature detection information INF_T, the heating data signal DAT_T to the memory bank circuit 730 illustrated in FIG. 7. The heating data signal DAT_T may have data of a logic high and data of a logic low, between which the heating data signal DAT_T toggles. Therefore, the data providing circuit 820 itself may generate heat through the toggling operation.

Referring back to FIG. 7, in accordance with an embodiment of the present disclosure, the semiconductor memory apparatus 700 in the forcible write mode may perform the write operation WT of storing the heating data signal DAT_T, which toggles, into the memory bank circuit 730. Therefore, the memory bank circuit 730 itself may generate heat through the toggling operation.

Figure 9:
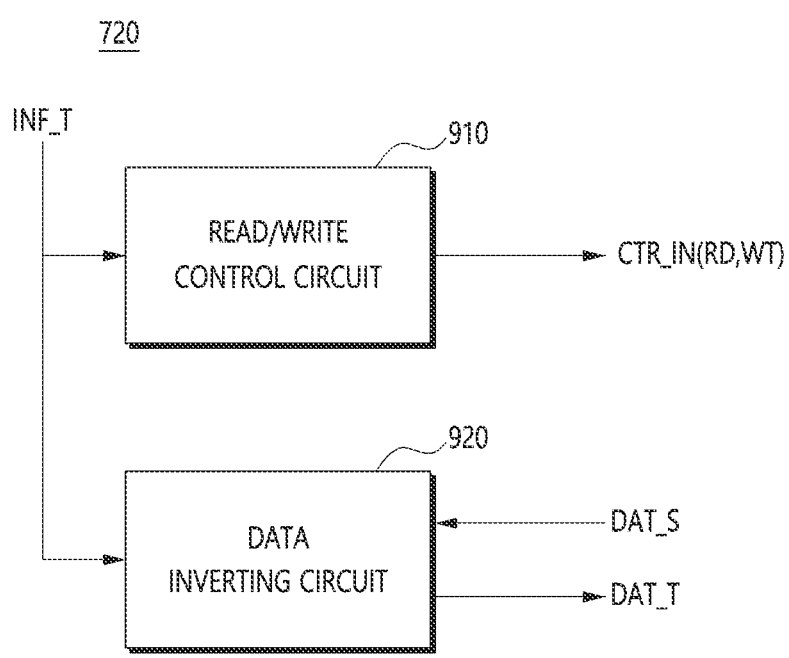
FIG. 9 is a block diagram illustrating a configuration of a heating control circuit illustrated in FIG. 7.

FIG. 9 is a block diagram illustrating a configuration of the heating control circuit 720 illustrated in FIG. 7. The configuration of the heating control circuit 720 illustrated in FIG. 9 may correspond to the inversion write mode. In the inversion write mode, a read operation RD may be performed to read out data from the memory bank circuit 730 illustrated in FIG. 7 and a write operation WT may be performed to invert the read-out data, the inverted read-out data becoming the heating data signal DAT_T, and to store the heating data signal DAT_T (i.e., the inverted read-out data) into the memory bank circuit 730. Therefore, the command control signal CTR_IN illustrated in FIG. 7 may include a read control signal for the read operation RD and a write control signal for the write operation WT. Hereinafter, for convenience of description, the command control signal CTR_IN may be referred to as the read/write control signals CTR_IN.

Referring to FIG. 9, the heating control circuit 720 may include a read/write control circuit 910 and a data inverting circuit 920.

The read/write control circuit 910 may be configured to generate the read/write control signals CTR_IN based on the temperature detection information INF_T. The read/write control signals CTR_IN may be a signal to control the read operation RD and the write operation WT of the memory bank circuit 730 illustrated in FIG. 7.

The data inverting circuit 920 may be configured to generate, based on the temperature detection information INF_T, the heating data signal DAT_T, which is inverted from a data signal DAT_S, i.e., the data read out from the memory bank circuit 730 illustrated in FIG. 7. Therefore, the data inverting circuit 920 may generate heat, itself, through the toggling operation.

Referring back to FIG. 7, in accordance with an embodiment of the present disclosure, the semiconductor memory apparatus 700 in the inversion write mode may perform the read operation RD of reading out data from the memory bank circuit 730 illustrated in FIG. 7 and may invert the read-out data to generate the heating data signal DAT_T. Further, the semiconductor memory apparatus 700 in the inversion write mode may perform the write operation WT of storing the heating data signal DAT_T into the memory bank circuit 730. Therefore, the memory bank circuit 730 itself may generate heat through the toggling operation. Therefore, the memory bank circuit 730 itself may generate heat through the toggling operation.

The memory bank circuit 730 may perform the toggling operation based on the heating data signal DAT_T that toggles. The configuration of the heating control circuit 720 according to the forcible write mode, as illustrated in FIG. 8, may be utilized when there is no data stored in the memory bank circuit 730. In the forcible write mode, heat may be generated by forcibly storing the heating data signal DAT_T, which toggles, into the memory bank circuit 730 when data stored in the memory bank circuit 730 is okay to be deleted from the memory bank circuit 730. The configuration of the heating control circuit 720 according to the inversion write mode, as illustrated in FIG. 9, may be utilized when there is data stored in the memory bank circuit 730. Differently from the forcible write mode, heat may be generated by repeatedly inverting data stored in the memory bank circuit 730 in the inversion write mode. Therefore, in the inversion write mode, performed even number of times may be a pair of the read operation RD and the write operation WT, the read operation RD being the operation of reading out data stored in the memory bank circuit 730 and the write operation WT being the operation of storing the heating data signal DAT_T into the memory bank circuit 730. As a result, the memory bank circuit 730 may keep the data stored therein even after the heating operation in the inversion write mode.

In accordance with an embodiment of the present disclosure, the semiconductor memory apparatus 700 may generate heat in any of the forcible write mode and the inversion write mode. Therefore, the temperature detecting circuit 710 may secure an appropriate temperature, at which a stable circuit operation can be performed because of the generated heat.

In accordance with an embodiment of the present disclosure, provided is a semiconductor apparatus and a semiconductor memory apparatus capable of performing a heating operation at a low temperature, which guarantees a stable circuit operation.

While certain embodiments have been described above, it will be understood to those skilled in the art that the embodiments described are by way of example only. Accordingly, the semiconductor apparatus and semiconductor memory apparatus should not be limited based on the described embodiments. Rather, the semiconductor apparatus and semiconductor memory apparatus described herein should only be limited in light of the claims that follow when taken in conjunction with the above description and accompanying drawings.

What is claimed is:

1. A semiconductor memory apparatus comprising:
    a command decoding circuit configured to generate an internal refresh command signal based on an external command signal;
    a temperature detecting circuit configured to detect a temperature to enable temperature detection information when the temperature is lower than a reference temperature;
    a refresh control circuit configured to generate a refresh control signal, which toggles at a first frequency, in response to the internal refresh command signal during a refresh operation and configured to generate the refresh control signal, which toggles at a second frequency higher than the first frequency, in response to an enabling of the temperature detection information during a heating operation; and
    a memory bank circuit configured to input the refresh control signal through a first transferring line and perform a refresh operation based on the refresh control signal,
    wherein the refresh control circuit is configured to generate heat through a toggling operation.

2. The semiconductor memory apparatus of claim 1, wherein the refresh control circuit includes:
    a first oscillating circuit configured to generate the refresh control signal having the second frequency based on the enabling of the temperature detection information and generate the refresh control signal having the second frequency; and
    a second oscillating circuit configured to generate the refresh control signal having the first frequency based on the internal refresh command signal.

3. The semiconductor memory apparatus of claim 1, further comprising a second transferring line coupled between the first transferring line and the memory bank circuit.

* * * * *